(12) United States Patent
Liu et al.

(10) Patent No.: US 11,606,086 B2
(45) Date of Patent: Mar. 14, 2023

(54) DESATURATION CIRCUIT FOR MOSFET WITH HIGH NOISE IMMUNITY AND FAST DETECTION

(71) Applicant: Hamilton Sundstrand Corporation, Charlotte, NC (US)

(72) Inventors: Bo Liu, Vernon, CT (US); Yongduk Lee, Vernon, CT (US); Xin Wu, Glastonbury, CT (US)

(73) Assignee: HAMILTON SUNDSTRAND CORPORATION, Charlotte, NC (US)

( * ) Notice: Subject to any disclaimer, the term of this patent is extended or adjusted under 35 U.S.C. 154(b) by 19 days.

(21) Appl. No.: 17/246,839

(22) Filed: May 3, 2021

(65) Prior Publication Data

US 2021/0351770 A1 Nov. 11, 2021

Related U.S. Application Data

(60) Provisional application No. 63/021,818, filed on May 8, 2020.

(51) Int. Cl.
| | | |
|---|---|---|
| *H02H 3/00* | (2006.01) | |
| *H03K 17/082* | (2006.01) | |
| *H02H 1/00* | (2006.01) | |
| *H03K 5/01* | (2006.01) | |
| *H03K 5/00* | (2006.01) | |

(52) U.S. Cl.
CPC ....... *H03K 17/0822* (2013.01); *H02H 1/0007* (2013.01); *H03K 5/01* (2013.01); *H03K 2005/00078* (2013.01)

(58) Field of Classification Search
CPC .......... H03K 17/0822; H03K 5/01; H03K 2005/00078; H03K 2217/0027; H02H 1/0007

USPC ........................................................ 361/91.5
See application file for complete search history.

(56) References Cited

U.S. PATENT DOCUMENTS

| | | | | |
|---|---|---|---|---|
| 5,500,616 A | * | 3/1996 | Ochi .................. | H03K 17/0822 |
| | | | | 327/422 |
| 5,687,049 A | * | 11/1997 | Mangtani ............. | H02H 7/1227 |
| | | | | 363/51 |
| 6,087,877 A | * | 7/2000 | Gonda ..................... | H03K 5/08 |
| | | | | 327/309 |

(Continued)

FOREIGN PATENT DOCUMENTS

| | | | | |
|---|---|---|---|---|
| EP | 0693826 A1 | | 1/1996 | |
| EP | 3907887 A1 | * | 11/2021 | ........... H02H 1/0007 |

(Continued)

OTHER PUBLICATIONS

European Search Report; dated Oct. 1, 2021; Application No. 21173097.3; Filed: May 10, 2021; 10 pages.

*Primary Examiner* — Ryan Jager
(74) *Attorney, Agent, or Firm* — Cantor Colburn LLP

(57) ABSTRACT

A desaturation protection circuit is provided. Aspects includes a main gate driver circuit driving a gate for a switch, a desaturation gate driver circuit coupled to a drain terminal of the switch, a PWM signal supply circuit configured to supply a PWM signal to the desaturation gate driver circuit, and a delay circuit, the delay circuit configured to delay the PWM signal from the PWM signal supply circuit to the desaturation gate driver circuit during a turn-on event for the switch.

18 Claims, 3 Drawing Sheets

(56) References Cited

U.S. PATENT DOCUMENTS

| | | | | |
|---|---|---|---|---|
| 6,097,582 | A * | 8/2000 | John | H03K 17/165 |
| | | | | 361/91.6 |
| 6,275,093 | B1 * | 8/2001 | Shekhawat | H03K 17/0828 |
| | | | | 361/91.8 |
| 7,176,744 | B2 * | 2/2007 | Goudo | H03K 17/08122 |
| | | | | 327/434 |
| 7,466,185 | B2 * | 12/2008 | Bayerer | H03K 17/168 |
| | | | | 327/434 |
| 7,768,337 | B2 * | 8/2010 | Bayerer | H03K 17/0422 |
| | | | | 361/100 |
| 8,885,310 | B2 * | 11/2014 | Kandah | H03K 17/0826 |
| | | | | 327/434 |
| 9,083,343 | B1 * | 7/2015 | Li | H03K 17/687 |
| 9,189,044 | B2 | 11/2015 | Jin et al. | |
| 9,729,150 | B2 * | 8/2017 | Ishimatsu | H03K 19/0016 |
| 10,063,227 | B2 * | 8/2018 | Bartolomeo | H03K 17/161 |
| 10,473,710 | B2 * | 11/2019 | Sullivan | G01R 31/2619 |
| 10,804,791 | B2 * | 10/2020 | Mondzik | H03K 17/0828 |
| 11,050,418 | B2 * | 6/2021 | Bachhuber | H03K 17/0828 |
| 2009/0153223 | A1 * | 6/2009 | Bayerer | H03K 17/567 |
| | | | | 327/389 |
| 2014/0203843 | A1 * | 7/2014 | Cottell | H03K 17/78 |
| | | | | 327/81 |
| 2014/0233278 | A1 * | 8/2014 | Li | H02M 7/53873 |
| | | | | 363/37 |
| 2015/0381031 | A1 * | 12/2015 | Ghosh | H02M 3/33507 |
| | | | | 363/21.12 |
| 2016/0028219 | A1 * | 1/2016 | Habu | H03F 3/217 |
| | | | | 361/101 |
| 2021/0351770 | A1 * | 11/2021 | Liu | H03K 17/0822 |

FOREIGN PATENT DOCUMENTS

| | | | | |
|---|---|---|---|---|
| JP | 2006295326 | * | 10/2006 | H03K 17/08 |
| JP | 2006295326 | A | 10/2006 | |
| KR | 102026931 | B1 | 10/2019 | |

* cited by examiner

DESATURATION CIRCUIT FOR MOSFET WITH HIGH NOISE IMMUNITY AND FAST DETECTION

CROSS-REFERENCE TO RELATED APPLICATIONS

This application claims the benefit of U.S. Application No. 63/021,818 filed May 8, 2020, which is incorporated herein by reference in its entirety.

BACKGROUND

The subject matter disclosed herein generally relates to desaturation circuits and, more particularly, to an improved desaturation circuit for SiC MOSFETs with high noise immunity and fast detection.

Fast fault detection and high noise immunity are two design aspects for protection of power semiconductor devices. For high power high power, high voltage silicon carbide (SiC) devices, these are particularly important as fault energy could be huge as a result of design-preferred low communication loop inductance. Meanwhile, annoying noises resulting from the high dv/dt and di/dt switching transients could also occur.

SiC metal-oxide semiconductor field effect transistors (MOSFETs) show better electric performance over their silicon counterparts as they can provide higher breakdown voltage, lower on-state resistance, and lower switching losses at the given die size and thickness. However, the overcurrent protection for SiC MOSFETs is still challenging because of high current stress during short circuit events and less withstand time compared to a silicon insulated gate bipolar junction transistor (IGBT). Such detection schemes include a DC-link voltage based detection, a source inductance of power loop based detection, a current-mirror-based detection, and an embedded Rogoski-coil-based detection circuit. Additionally, soft turn-off methods have been proposed such as using an external circuit breaker and multi-level turn-off gate drivers. Nevertheless, additional components and more complicated circuits are required for these proposed schemes and turn-off methods. In addition, there exists potential risks for mis-triggering the circuit during normal operation.

BRIEF DESCRIPTION

According to one embodiment a desaturation protection circuit is provided. The circuit includes a main gate driver circuit driving a gate for a switch, a desaturation gate driver circuit coupled to a drain terminal of the switch, a PWM signal supply circuit configured to supply a PWM signal to the desaturation gate driver circuit, and a delay circuit, the delay circuit configured to delay the PWM signal from the PWM signal supply circuit to the desaturation gate driver circuit during a turn-on event for the switch.

According to another embodiment, a desaturation protection circuit is provided. The circuit includes a main gate driver circuit driving a gate for a switch, a desaturation gate driver circuit coupled to a drain terminal of the switch, a PWM signal supply circuit configured to supply a PWM signal to the desaturation gate driver circuit, and a delay circuit, the delay circuit configured to delay the PWM signal from the PWM signal supply circuit to the desaturation gate driver circuit during a turn-on event for the switch.

The foregoing features and elements may be combined in various combinations without exclusivity, unless expressly indicated otherwise. These features and elements as well as the operation thereof will become more apparent in light of the following description and the accompanying drawings. It should be understood, however, that the following description and drawings are intended to be illustrative and explanatory in nature and non-limiting.

BRIEF DESCRIPTION OF THE DRAWINGS

The foregoing and other features, and advantages of the present disclosure are apparent from the following detailed description taken in conjunction with the accompanying drawings in which.

DETAILED DESCRIPTION

Figure 1:
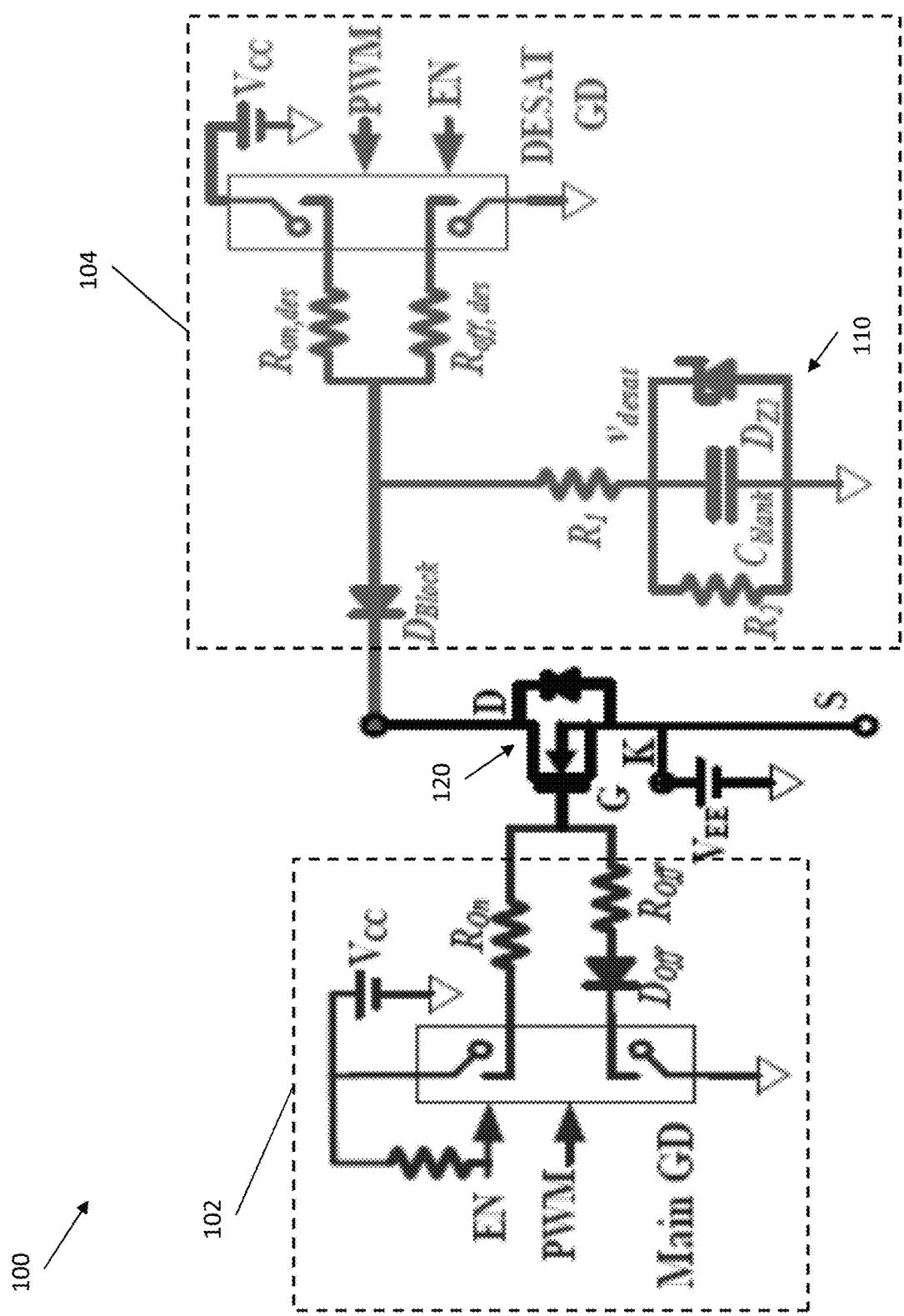
FIG. 1 depicts a circuit diagram for a typical desaturation protection circuit according to one or more embodiments.

As shown and described herein, various features of the disclosure will be presented. Various embodiments may have the same or similar features and thus the same or similar features may be labeled with the same reference numeral, but preceded by a different first number indicating the figure to which the feature is shown. Thus, for example, element "a" that is shown in FIG. X may be labeled "Xa" and a similar feature in FIG. Z may be labeled "Za." Although similar reference numbers may be used in a generic sense, various embodiments will be described and various features may include changes, alterations, modifications, etc. as will be appreciated by those of skill in the art, whether explicitly described or otherwise would be appreciated by those of skill in the art.

Embodiments described herein are directed to an improved desaturation circuit for SiC MOSFETs that provides for high noise immunity and fast detection. An RCD delay matching circuit is included in a desaturation protection path for the desaturation circuit to purposely offset the turn-on delay with no impact on the turn-off performance, thus eliminating the high turn-on noise spike and allows for a lower blanking capacitor and lower protection threshold.

Desaturation protection circuits monitors switch voltage while the switch conducts current. In the case current becomes excessive, the protection circuit would detect enlarged switch voltage and trigger the safe turn off. The turn off process results in large voltage overshoot across the main terminals. This excess voltage could destroy the device under unfavorable conditions, specifically an excessive current situation. The desaturation detection circuit includes a 'blanking' time to prevent premature reaction and possibly a level adjusting feature.

FIG. 1 depicts a circuit diagram for a typical desaturation protection circuit according to one or more embodiments. The desaturation protection circuit 100 includes a SiC MOSFET 120 with a main gate driver circuit 102 and an auxiliary gate driver circuit 104 to charge and discharge the blanking capacitor $C_{BLANK}$. The desaturation protection circuit 100 separates the main gate driving signal and the desaturation gating signal which allows for more flexibility and controllability for both turn-on and turn-off transient. The main gate driver circuit 102 and the auxiliary (desaturation) gate drive circuit 104 both share the same isolated pulse width modulation (PWM) signal. The PWM signal can be generated by a PWM signal supply circuit. The auxiliary gate drive circuit 104 includes resistors $R_{ON,DES}$, $R_1$, and $R_2$ with resistive ranges in the kΩ range. These resistors determine the charging current and speed of the blanking capacitor $C_{BLANK}$, and limit the current pulled from the auxiliary desaturation gate driver circuit 104. Resistor $R_{OFF,DES}$ is set at the Ω range. With such a low impedance, the desaturation protection circuit can bypass the high dv/dt induced displacement noise current at the SiC MOSFET 120 turn-off. The turn-on dv/dt noise during the switching transient is also low since $R_1$ is selected at a resistance that provides enough damping.

In one or more embodiments, to avoid false triggering at the turn-on in the desaturation protection circuit 100, a blanking time is inserted to skip the possible noise on the resistor $R_2$ and await the SiC MOSFET 120 voltage VDS decaying to the steady-state level when the MOSFET 120 enters the ohmic region and diode $D_{BLOCK}$ conducts. This blanking time function is implemented in the RC circuit 110. The RC circuit 110 includes the blanking capacitor $C_{BLANK}$ and resistor $R_2$. A Zener diode $D_{Z2}$ is in parallel with the blanking capacitor. A comparator (not shown) is utilized to compare the voltage across $C_{BLANK}$ to a reference voltage. The output of the comparator controls the PWM signal supply circuit that supplies the PWM signal to the gate driver 102 and the auxiliary gate driver 104. When the voltage across $C_{BLANK}$ is larger than the reference voltage, the PWN signal is shut down thus turning off the gate driver 102 and the auxiliary gate driver 104. The reference voltage can be set as the desaturation voltage threshold for the MOSFET 120. However, a problem exists with relying solely on the blanking capacitor $C_{BLANK}$ to blank the turn-on switching transient in that there will always be a high voltage spike on the DESAT signal during this transient. Therefore, long blanking time has to be reserved so that during the fault condition, the $C_{BLANK}$ can be continually charged to the DESAT threshold which is higher than normal peak spike. This is particularly true with high power, high speed SiC MOSFETs where the high transient voltage (dv/dt) electric field and transient current (di/dt) magnetic field around the power devices and switching loops can likely couple spurious noises on to the gate driver circuit 102. Hence, more protection voltage margin or lower blanking time may be needed to avoid false triggering. This, however, slows down the fault detection and protection.

Figure 2:
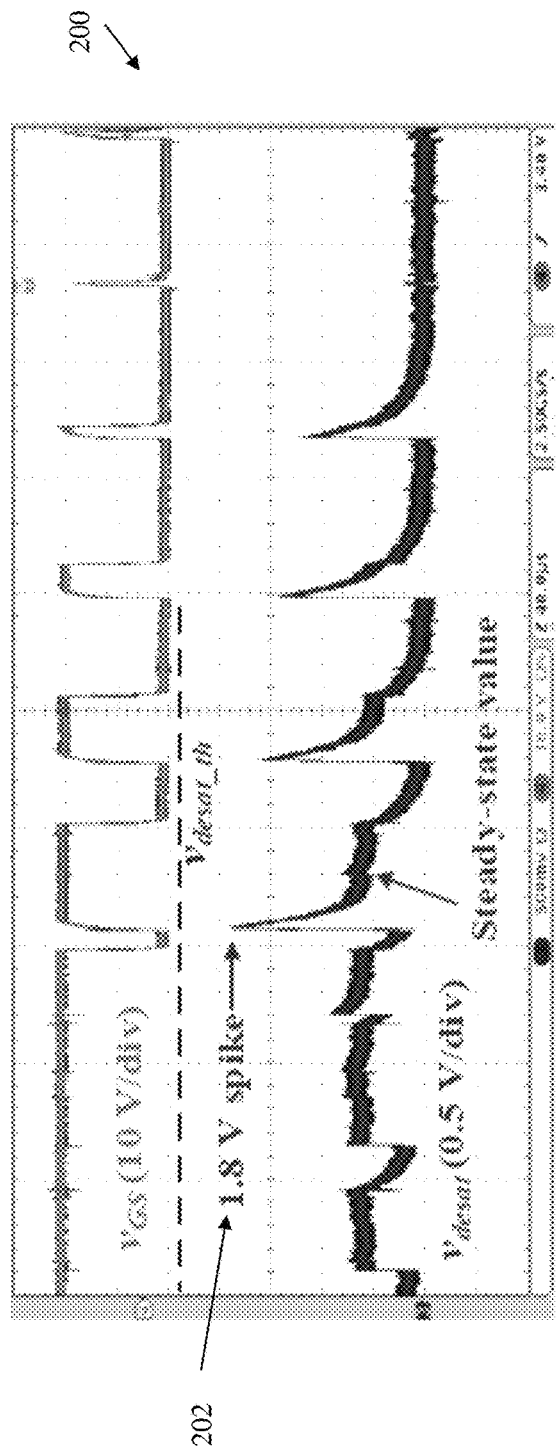
FIG. 2 depicts waveforms illustrating a noise spike from an inverter under normal operation under full load and 30% nominal voltage according to one or more embodiments.
Figure 3:
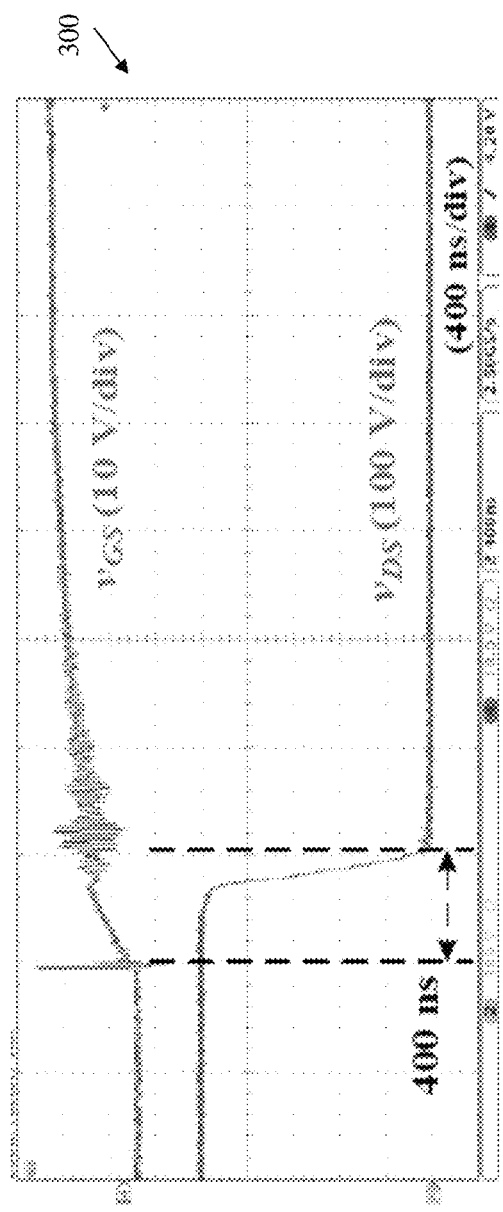
FIG. 3 depicts waveforms illustrating the measured turn-on delay of 400 ns for a 1200V SiC MOSFET on a double pulse tester (DPT) under 500 $V_{DC}$ and 100 A according to one or more embodiments.

FIG. 2 depicts waveforms illustrating a noise spike from an inverter under normal operation under full load and 30% nominal voltage according to one or more embodiments. As described above, while the turn-off noise on the DESAT signal is negligible, the spike 202 during the turn-on transient is significant. This spike 202 is much higher than the steady-state value when the switching is fully on, such that the margin is even lower and easily triggers the fault protection under normal operation. Although the blanking time is initially set to cover the rated power condition, the value often needs to be adjusted in the high dv/dt and high di/dt environment which complicates the development and testing. This high spike 202 is produced because of the delay between device-fully-on instant and the $V_{GS}$ turn-on instant, during which the blanking capacitor is charged up. For a given design, this turn-on delay is a function of the device current and voltage. Higher drain current and DC blocking voltage lead to high delay. FIG. 3 depicts waveforms illustrating the measured turn-on delay of 400 ns for a 1200V SiC MOSFET on a double pulse tester (DPT) under 500 $V_{DC}$ and 100 A according to one or more embodiments. The turn-on delay for a range of current between 100 A and 700 A can be similarly tested resulting in about 100 ns delay. Thus, a 500 ns delay can be selected as a worst case delay time to cover the above mentioned current range.

Figure 4:
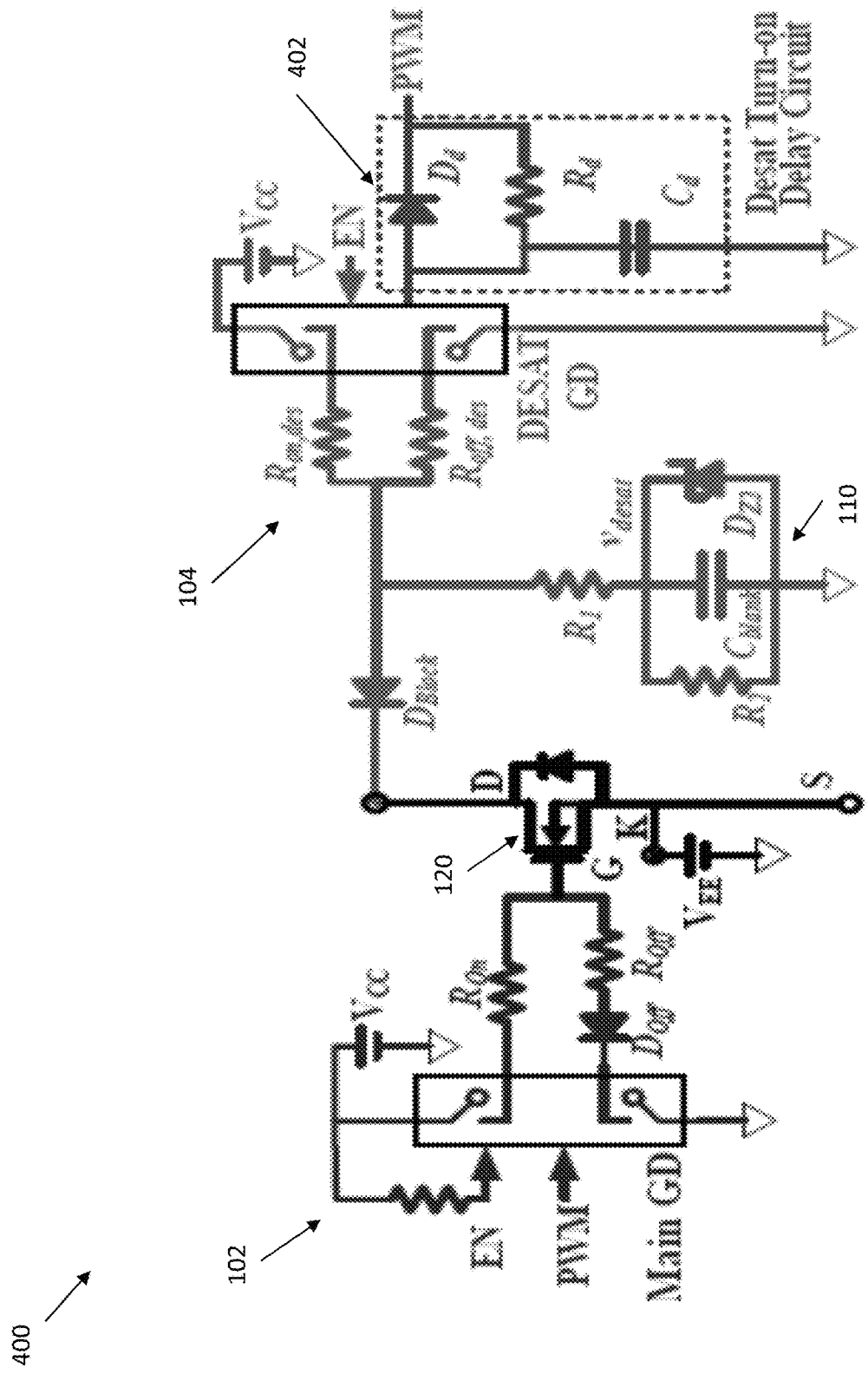
FIG. 4 depicts a circuit diagram of a proposed desaturation protection circuit including a turn-on delay matching circuit according to one or more embodiments.

FIG. 4 depicts a circuit diagram of a desaturation protection circuit including a turn-on delay matching circuit according to one or more embodiments. The circuit 400 includes all the elements of FIG. 1 along with a turn-on delay matching circuit 402. The same number convention has been utilized from FIG. 1 for ease of illustration. To eliminate the unwanted DESAT turn-on spike, an RCD turn-on matching circuit 402 is provided which includes a diode $D_d$, resistor $R_d$, and a capacitor $C_d$. During turn-on, the RC filter introduces a delay of the PWM signal that is also shared by the main gate driver 102. The delay time defined from 0 volt to the transistor to transistor logic (TTL) input threshold of the auxiliary DESAT driver IC is set to be 500 ns, for example, which offsets the delay of the MOSFET 120. In one or more embodiments, the SiC MOSFET 120 is an n-type MOSFET. It should be noted that the 500 ns delay is merely exemplary and is not intended to limit the scope of this disclosure. The TTL input threshold can be set to any delay time either greater than or lower than 500 ns. In one or more embodiments, at turn-off, diode $D_d$ will conduct therefore not affecting the turn-off performance for discharging of the blanking capacitor or filtering of turn-off dv/dt noise. Because the $R_d$ and $C_d$ low pass filter delay the turn-on so that the desaturation circuit voltage $V_{CC}$ is charging the R2 and Cblank at the moment that SiC MOSFET is on and $D_{Block}$ is on, there will be no pre-charged voltage on the $C_{blank}$. Therefore, $V_{desat}$ will not see a turn-on spike as would see in the typical implementation. Hence, the need of $C_{blank}$ in the traditional desaturation circuit to absorb the noise and blank the protection logic is gone. Therefore, the $C_{blank}$ could be eliminated. However, a small $C_{blank}$ is still utilized in case of imperfect matching of the turn-on delay as the power device turn-on is a function of power voltage and current, or in case of other potentially high frequency noise in the high di/dt dv/dt working environment. However, unlike the delay introduced by $C_{blank}$, which is usually not easy to accurately model (although it can be roughly estimated as a RC charging circuit with $(R_{on\_des}+R_1)//R_2//C_{blank}$ time constant) and control due to the interaction of both protection circuit and power device circuit through the $D_{block}$ during the initial period of the very short turn-on fault transient and the complexity of tuning the multiple RC components since they affect both the steady-state and transient voltage distribution, the proposed delay circuit is independently operated from the power circuit in the protection transient. Therefore, its delay time can be easily designed and controlled, and much accurate than $C_{blank}$ approach. Its need for additional margin is smaller. Whereas, the $C_{blank}$ approach often requires much longer delay time as the safety margin to avoid the noise spike under the normal operation.

Technical benefits of this RCD delay circuit include providing for lower noise allowing for the DESAT threshold to be decreased considerably. For SiC MOSFETs, since their saturation region is not clearly defined from output characteristic curves, the keen point does not exist. Often a relatively high threshold is used to avoid false triggering, leaving less safe operating regions (SOA). With a lower current trip level, more device SOA margin is guaranteed.

Also, the blanking capacitance can now be significantly reduced or even reduced to zero as there is no need to provide further blanking time. With low blanking time, the protection speed and be improved. The difference between the RCD delay approach and the traditional $C_{blank}$ approach is described below with a focus on the speed and noise immunity, and consider the two typical fault cases, i.e. hard switching fault (HSF) and fault under load (FUL). In the HSF case, the fault occurs when the switch is turned-on. Both the RCD delay scheme and the $C_{blank}$ approach will introduce the blanking time. However, as the traditional $C_{blank}$ approach requires longer blanking time to avoid the noise spike under the normal operation, the RCD delay approach may still be a bit speedy. On the other hand, given the same blanking time, the RCD delay approach can allow lower protection threshold due to lower noises. In the FUL case, the benefit of RCD delay approach is more pronounced in terms of fault detection speed, as the switch is already on and there is no turning-on action and delay. The DESAT signal will grow up from the steady-state level until it reaches the protection threshold. Since the blanking capacitance in the RCD delay approach is significantly reduced, its detection time will be much shorter given the same threshold. With lower load current, the steady-state DESAT voltage is lower, and after a fault instance, it takes more time to reach the protection level. In the case of smaller $C_{blank}$, the charging slope is steeper and the absolute time saving is more.

While the present disclosure has been described in detail in connection with only a limited number of embodiments, it should be readily understood that the present disclosure is not limited to such disclosed embodiments. Rather, the present disclosure can be modified to incorporate any number of variations, alterations, substitutions, combinations, sub-combinations, or equivalent arrangements not heretofore described, but which are commensurate with the scope of the present disclosure. Additionally, while various embodiments of the present disclosure have been described, it is to be understood that aspects of the present disclosure may include only some of the described embodiments.

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description has been presented for purposes of illustration and description, but is not intended to be exhaustive or limited to the embodiments in the form disclosed. Many modifications and variations will be apparent to those of ordinary skill in the art without departing from the scope of the disclosure. The embodiments were chosen and described in order to best explain the principles of the disclosure and the practical application, and to enable others of ordinary skill in the art to understand various embodiments with various modifications as are suited to the particular use contemplated.

The present embodiments may be a system, a method, and/or a computer program product at any possible technical detail level of integration. The computer program product may include a computer readable storage medium (or media) having computer readable program instructions thereon for causing a processor to carry out aspects of the present disclosure.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Aspects of the present invention are described herein with reference to flowchart illustrations and/or block diagrams of methods, apparatus (systems), and computer program products according to embodiments. It will be understood that each block of the flowchart illustrations and/or block diagrams, and combinations of blocks in the flowchart illustrations and/or block diagrams, can be implemented by computer readable program instructions.

The flowchart and block diagrams in the Figures illustrate the architecture, functionality, and operation of possible implementations of systems, methods, and computer program products according to various embodiments. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

Accordingly, the present disclosure is not to be seen as limited by the foregoing description, but is only limited by the scope of the appended claims.

What is claimed is:

1. A desaturation protection circuit comprising:
a main gate driver circuit driving a gate for a switch;
a desaturation gate driver circuit comprising a resistor-capacitor circuit coupled to a drain terminal of the switch;
a PWM signal supply circuit configured to supply a PWM signal to the desaturation gate driver circuit; and
a delay circuit, the delay circuit configured to delay the PWM signal from the PWM signal supply circuit to the desaturation gate driver circuit during a turn-on event for the switch,
wherein the delay circuit comprises a first resistor, a first capacitor (Cd), and a first diode (Dd), wherein the first diode (Dd) is connected to the delay circuit, and wherein the first resistor (Rd) and the first capacitor (Cd) are connected together to form a low pass filter that that delays the turn-on event,
wherein the resistor-capacitor circuit comprises a second resistor (R2) and a blanking capacitor (Cblank) connected in parallel with second resistor (R2), and
wherein at turn-off, the first diode (Dd) conducts without affecting a turn-off performance for discharging of the blanking capacitor (Cblank).

2. The desaturation protection circuit of claim 1, wherein delay circuit comprises a first resistor, a first capacitor, and a first diode.

3. The desaturation protection circuit of claim 1, wherein the resistor-capacitor circuit is coupled to the drain terminal of the switch through and a blocking diode.

4. The desaturation protection circuit of claim 3, wherein the resistor-capacitor circuit comprises a second resistor and a blanking capacitor.

5. The desaturation protection circuit of claim 4 further comprising a comparator configured to compare a voltage across the blanking capacitor to a reference voltage.

6. The desaturation protection circuit of claim 5, wherein an output of the comparator comprises a control input for the PWM signal supply circuit.

7. The desaturation protection circuit of claim 6, wherein the PWM signal supply circuit supplies the PWM signal to the main gate driver circuit; and
wherein the control input for the PWM signal supply circuit operates the PWM signal supply circuit in an off mode based on the voltage across the blanking capacitor being greater than the reference voltage.

8. The desaturation protection circuit of claim 7, wherein the reference voltage comprises a desaturation threshold voltage of the switch.

9. The desaturation protection circuit of claim 1, wherein the switch comprises a silicon carbide metal-oxide-semiconductor field effect transistor (MOSFET).

10. The desaturation protection circuit of claim 9, wherein the silicon carbide MOSFET comprises an n-type MOSFET.

11. A desaturation protection circuit comprising:
a desaturation gate driver circuit comprising a resistor-capacitor circuit connected to a blocking diode, the desaturation gate driver circuit coupled to a drain terminal of a switch through a blocking diode;
a PWM signal supply circuit configured to supply a PWM signal to the desaturation gate driver circuit; and
a delay circuit, the delay circuit configured to delay the PWM signal from the PWM signal supply circuit to the desaturation gate driver circuit during a turn-on event for the switch,
wherein delay circuit comprises a first resistor, a first capacitor (Cd), and a first diode (Dd), wherein the first diode (Dd) is connected to the delay circuit, and wherein the first resistor (Rd) and the first capacitor (Cd) are connected together to form a low pass filter that that delays the turn-on event,
wherein the resistor-capacitor circuit comprises a second resistor (R2) and a blanking capacitor (Cblank) connected in parallel with second resistor (R2), and
wherein the desaturation gate driver circuit (104) controls charging and discharging of the blanking capacitor (Cblank), and
wherein at turn-off, the first diode (Dd) conducts without affecting the turn-off performance for discharging of the blanking capacitor (Cblank).

12. The desaturation protection circuit of claim 11, wherein the desaturation gate driver circuit further a Zener diode connected in parallel with the blanking capacitor.

13. The desaturation protection circuit of claim 12 further comprising a comparator configured to compare a voltage across the blanking capacitor to a reference voltage.

14. The desaturation protection circuit of claim 13, wherein an output of the comparator comprises a control input for the PWM signal supply circuit.

15. The desaturation protection circuit of claim 14, further comprising: a main gate driver circuit driving a gate for the switch, wherein the PWM signal supply circuit supplies the PWM signal to the main gate driver circuit; and
wherein the control input for the PWM signal supply circuit operates the PWM signal supply circuit in an off mode based on the voltage across the blanking capacitor being greater than the reference voltage.

16. The desaturation protection circuit of claim 15, wherein the reference voltage comprises a desaturation threshold voltage of the switch.

17. The desaturation protection circuit of claim 11, wherein the switch comprises a silicon carbide metal-oxide-semiconductor field effect transistor (MOSFET).

18. The desaturation protection circuit of claim 17, wherein the silicon carbide MOSFET comprises an n-type MOSFET.

* * * * *